United States Patent
Sweatt et al.

(10) Patent No.: US 6,285,737 B1
(45) Date of Patent: Sep. 4, 2001

(54) CONDENSER FOR EXTREME-UV LITHOGRAPHY WITH DISCHARGE SOURCE

(75) Inventors: William C. Sweatt, Albuquerque, NM (US); Glenn D. Kubiak, Livermore, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/489,163

(22) Filed: Jan. 21, 2000

(51) Int. Cl.[7] .................................................. G02B 5/08
(52) U.S. Cl. ........................ 378/85; 378/34; 359/350; 359/357
(58) Field of Search ...................... 378/34, 35, 84, 378/85, 145; 359/350, 357

(56) References Cited

U.S. PATENT DOCUMENTS

| | | |
|---|---|---|
| 5,268,951 | 12/1993 | Flamholz et al. . |
| 5,315,629 | 5/1994 | Jewell et al. . |
| 5,339,346 | 8/1994 | White . |
| 5,439,781 | 8/1995 | MacDowell et al. . |
| 5,461,657 | 10/1995 | Hayashida et al. . |
| 5,499,282 | 3/1996 | Silfvast . |
| 5,512,759 | 4/1996 | Sweatt . |
| 5,577,092 | 11/1996 | Kubiak et al. . |
| 5,805,365 | 9/1998 | Sweatt . |
| 6,118,577 | * 9/2000 | Sweat et al. ........................ 369/351 |
| 6,210,865 | * 4/2001 | Sweat et al. ........................ 430/311 |
| 6,225,027 | * 5/2001 | Replogle et al. ................... 430/311 |

OTHER PUBLICATIONS

Silfvast, W.T. et al., "High–power plasma discharge source at 13.5 nm and 11.4 nm for EUV lithography".

Klosner, M.A., et al., "Intense plasma discharge source at 13.5 nm for extreme–ultraviolet lithography" *Optics Letters*, vol. 22, No. 1, 1997 p. 34–36.

Kubiak, G.D., "High–power extreme ultraviolet source based on gas jets", *SPIE*, vol. 3331, p. 81–89.

Klosner, M.A. et al., "Intense xenon capillary discharge extreme–ultraviolet source in the 10–16–nm–wavelength region", *Optics Letters*, vol. 23, No. 20, p. 1609–1611.

Shack, R.V., Proceedings of the Society of Photo–optical Instrumentation Engineers, Aug. 27–29, 1973, San Diego, California, vol. 39, pp. 127–140..

* cited by examiner

*Primary Examiner*—David P. Porta
(74) *Attorney, Agent, or Firm*—Burns, Doane, Swecker & Mathis, L.L.P.

(57) ABSTRACT

Condenser system, for use with a ringfield camera in projection lithography, employs quasi grazing-incidence collector mirrors that are coated with a suitable reflective metal such as ruthenium to collect radiation from a discharge source to minimize the effect of contaminant accumulation on the collecting mirrors.

24 Claims, 5 Drawing Sheets

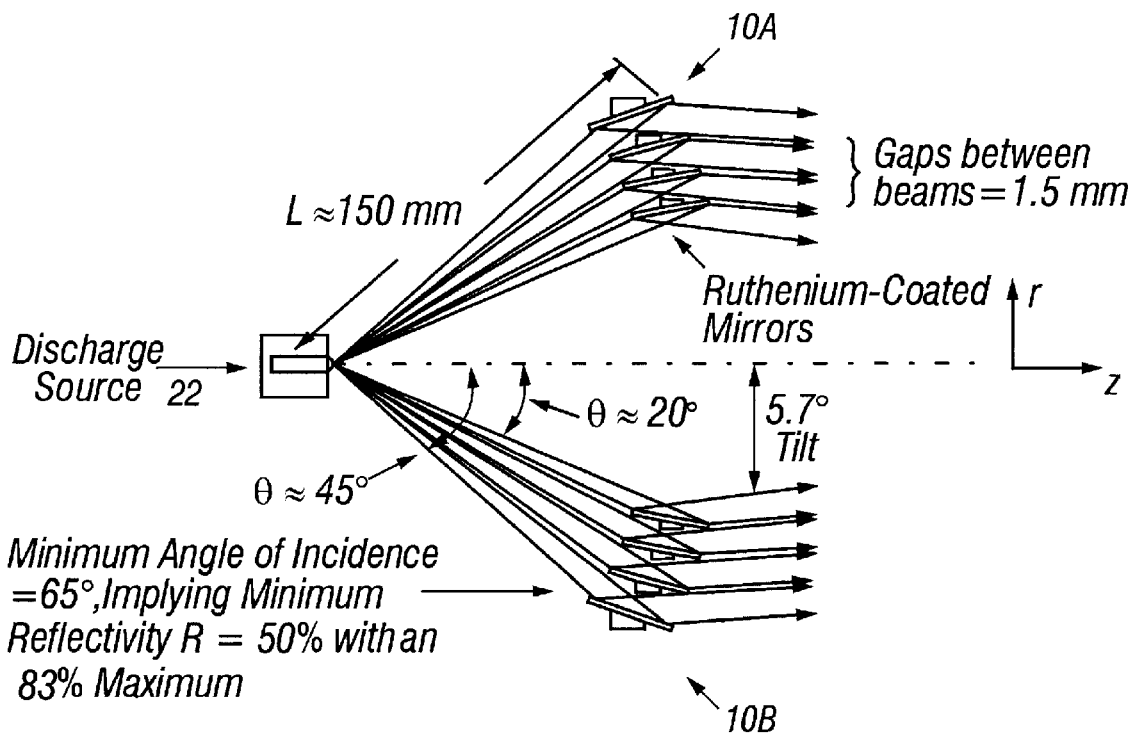
FIG. 2A: Grazing Incidence Collectors; two of six nested groups, each is abput a 52° arc. Solid angle collected ≈ 0.94 sr
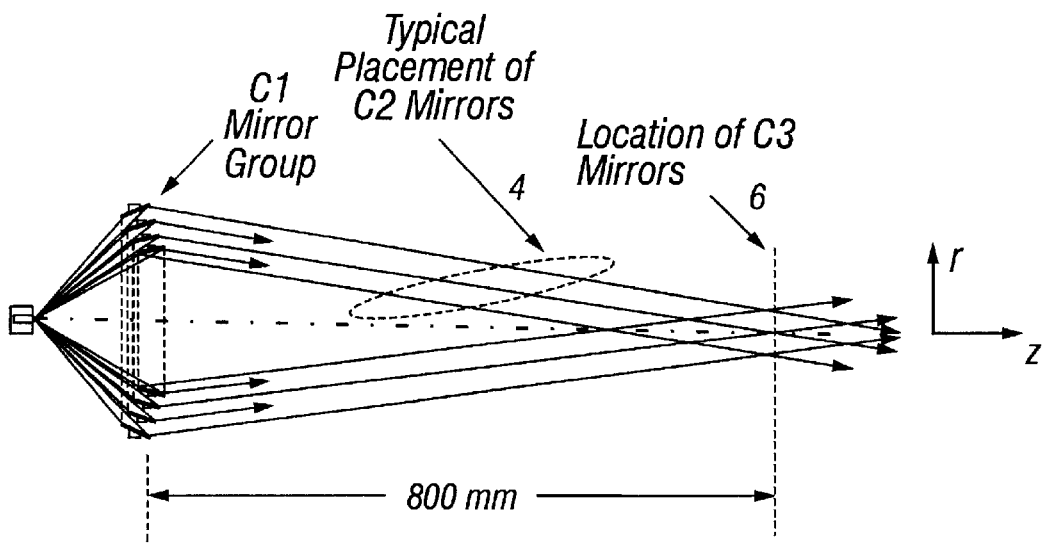
FIG. 2B: View of C1 Mirror in System

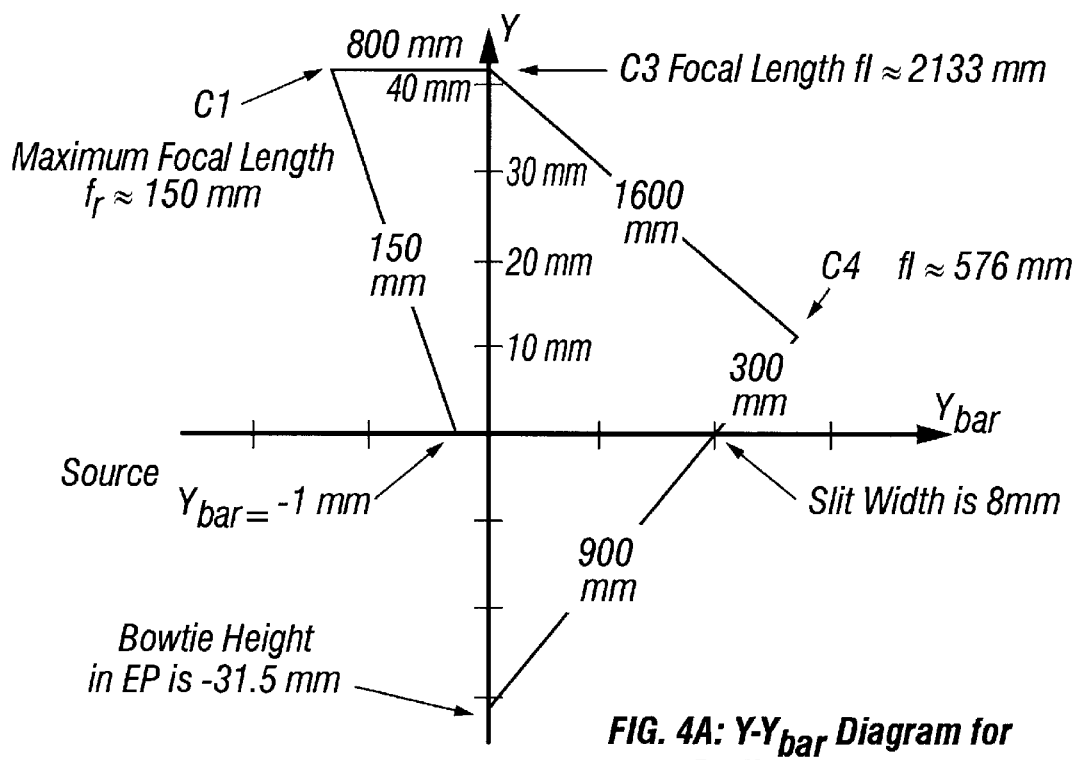
FIG. 4A: $Y$-$Y_{bar}$ Diagram for Radial Direction
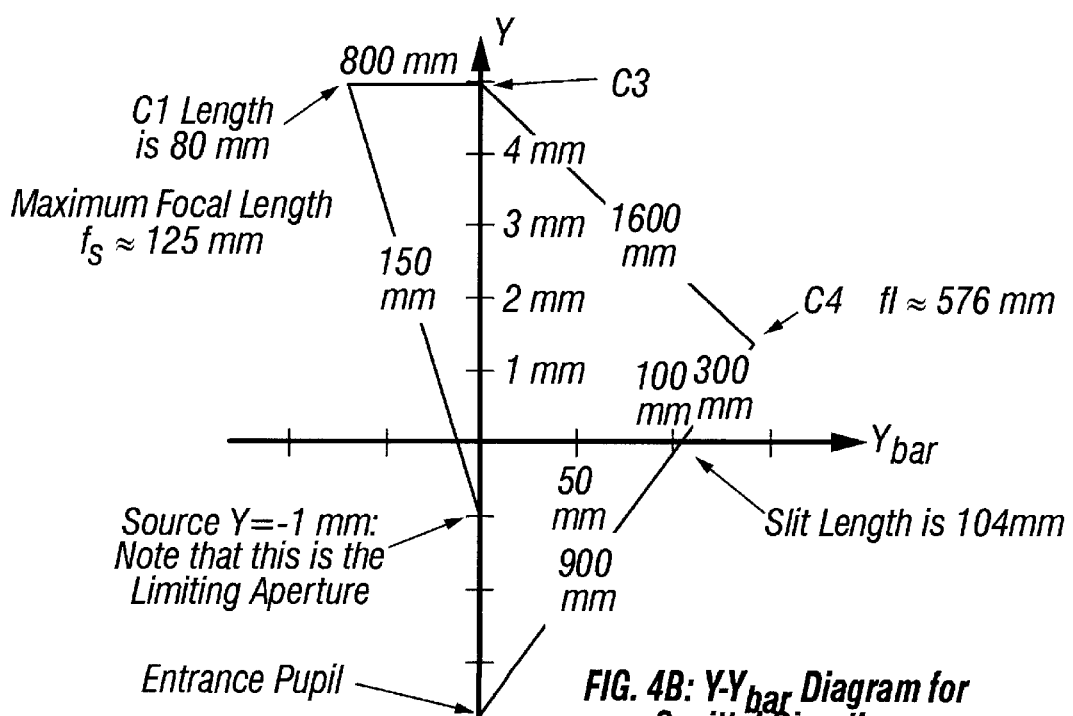
FIG. 4B: $Y$-$Y_{bar}$ Diagram for Sagittal Direction
Note: This is identical to Radial Direction $Y$-$Y_{bar}$ except for the source location.

CONDENSER FOR EXTREME-UV LITHOGRAPHY WITH DISCHARGE SOURCE

This invention was made with Government support under Contract No. DE-AC04-94AL85000 awarded by the U.S. Department of Energy to Sandia Corporation. The Government has certain rights to the invention.

FIELD OF THE INVENTION

This invention relates to condensers that collect radiation and deliver it to a ringfield camera. More particularly, this condenser collects radiation, here extreme ultraviolet and soft x-rays, from a discharge source and couples it to the ringfield of a camera designed for projection lithography.

BACKGROUND OF THE INVENTION

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing. As feature sizes are driven smaller and smaller, optical systems are approaching their limits caused by the wavelengths of the optical radiation. "Long" or "soft" x-rays (a.k.a. Extreme UV) (wavelength range of $\lambda = 100$ to $200$ Å ("Angstrom") are now at the forefront of research in efforts to achieve the smaller desired feature sizes. Soft x-ray radiation, however, has its own problems. The complicated and precise optical lens systems used in conventional projection lithography do not work well for a variety of reasons. Chief among them is the fact that there are no transparent, non-absorbing lens materials for soft x-rays and most x-ray reflectors have efficiencies of only about 70%, which in itself dictates very simple beam guiding optics with very few surfaces.

One approach has been to develop cameras that use only a few surfaces and can image with acuity (i.e., sharpness of sense perception) only along a narrow arc or ringfield. Such cameras then scan a reflective mask across the ringfield and translate the image onto a scanned wafer for processing. Although cameras have been designed for ringfield scanning (e.g., Jewell et al., U.S. Pat. No. 5,315,629 and Offner, U.S. Pat. No. 3,748,015), available condensers that can efficiently couple the light from an EUV source to the ringfield required by this type of camera have not been fully explored.

The present state-of-the-art for Very Large Scale Integration ("VLSI") involves chips with circuitry built to design rules of 0.25 μm. Effort directed to further miniaturization takes the initial form of more fully utilizing the resolution capability of presently-used ultraviolet ("UV") delineating radiation. "Deep UV" (wavelength range of $\lambda = 0.3$ μm to $0.1$ μm), with techniques such as phase masking, off-axis illumination, and step-and-repeat may permit design rules (minimum feature or space dimension) of 0.18 μm or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths. Various x-ray radiation sources are under consideration. One source, the electron storage ring synchrotron, has been used for many years and is at an advanced stage of development. Synchrotrons are particularly promising sources of x-rays for lithography because they provide very stable and defined sources of x-rays, however, synchrotrons are massive and expensive to construct. They are cost effective only when serving several steppers.

Another source is the laser plasma source (LPS), which depends upon a high power, pulsed laser (e.g., a yttrium aluminum garnet ("YAG") laser), or an excimer laser, delivering 500 to 1,000 watts of power to a 50 μm to 250 μm spot, thereby heating a source material to, for example, 250,000° C., to emit x-ray radiation from the resulting plasma. LPS is compact, and may be dedicated to a single production line (so that malfunction does not close down the entire plant). The plasma is produced by a high-power, pulsed laser that is focused on a metal surface or in a gas jet. (See, Kubiak et al., U.S. Pat. No. 5,577,092 for a LPS design and Sweatt U.S. Pat. No. 5,805,365 for a scanned ringfield lithographic camera with a large etendue (a.k.a., Lagrange Optical Invariant or throughput) that allows a greater percentage of EUV photons from a "broad" source, such as a LPS, to be used by the lithography camera.)

Another source is the capillary discharge source described in Silfvast, U.S. Pat. 5,499,282, which promised to be significantly less expensive and far more efficient than the laser plasma source. However, the discharge source ejects debris, eroded from the capillary and electrode bore, which can coat nearby optics. If these optics have multilayer coatings, a few Angstroms of metal deposited on top will severely affect the EUV reflectance.

A variety of x-ray patterning approaches are under study. Probably the most developed form of x-ray lithography is proximity printing. In proximity printing, object:image size ratio is necessarily limited to a 1:1 ratio and is produced much in the manner of photographic contact printing. A fine-membrane mask is maintained at one or a few microns spacing from the wafer (i.e., out of contact with the wafer, thus, the term "proximity"), which lessens the likelihood of mask damage but does not eliminate it. Making perfect masks on a fragile membrane continues to be a major problem. Necessary absence of optics in-between the mask and the wafer necessitates a high level of parallelism (or collimation) in the incident radiation. X-ray radiation of wavelength $\lambda \leq 16$ Å is required for 0.25 μm or smaller patterning to limit diffraction at feature edges on the mask.

Use has been made of the synchrotron source in proximity printing. Consistent with traditional, highly demanding, scientific usage, proximity printing has been based on the usual small collection arc. Relatively small power resulting from the 10 mrad to 20 mrad arc of collection, together with the high-aspect ratio of the synchrotron emission light, has led to use of a scanning high-aspect ratio illumination field (rather than the use of a full-field imaging field).

Projection lithography has natural advantages over proximity printing. One advantage is that the likelihood of mask damage is reduced because the mask does not have to be positioned within microns of the wafer as is the case for proximity printing. The cost of mask fabrication is considerably less because the features are larger. Imaging or camera optics in-between the mask and the wafer compensate for edge scattering and, so, permit use of longer wavelength radiation. Use of extreme ultra-violet radiation (a.k.a., soft x-rays) in bands at which multilayer coatings have been developed (i.e., λ=13.4 nm, λ=11.4 nm) allows the use of near-normal reflective optics. This in turn has lead to the development of lithography camera designs that are nearly diffraction limited over useable image fields. The resulting system is known as extreme UV ("EUVL") lithography (a.k.a., soft x-ray projection lithography ("SXPL")).

A favored form of EUVL projection optics is the ringfield camera. All ringfield optical forms are based on radial dependence of aberration and use the technique of balancing low order aberrations, i.e., third order aberrations, with higher order aberrations to create long, narrow arcuate fields of aberration correction located at a fixed radius as measured from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. See, FIG. 4 of U.S. Pat. No. 5,315,629 for an exemplary schematic representation of an arcuate slit defined by width, W, and length, L, and depicted as a portion of a ringfield defined by radial dimension, R, spanning the distance from an optic axis and the center of the arcuate slit. The strip width defines a region in which features to be printed are sharply imaged. Outside this region, increasing residual astigmatism, distortion, and Petzval curvature at radii greater or smaller than the design radius reduce the image quality to an unacceptable level. Use of such an arcuate field allows minimization of radially-dependent image aberrations in the image and use of object:image size reduction of, for example, 4:1 reduction, results in significant cost reduction of the, now, enlarged-feature mask.

Sweatt, U.S. Pat. No. 5,361,292, discloses a condenser that includes a series of aspheric mirrors on one side of a small, incoherent source of radiation. If the mirrors were continuously joined into a parent mirror, they would image the quasi point source into a ring image with a diameter of a few tens of centimeters at some distance, here some number of meters. Since only a relatively small arc (about 60 degrees) of the ring image is needed by the camera, the most efficient solution is to have about five 60 degrees beams, all of which are manipulated such that they all fall onto the same arc needed by the camera. Also, all of the beams must be aimed through the camera's virtual entrance pupil. These requirements are met in two steps.

First, the beams are individually rotated and translated, as necessary, using mirrors so that they overlap at the ringfield and pass through the real entrance pupil. The second step is to image this real entrance pupil into the camera's virtual entrance pupil using a powered imaging mirror. This places the corrected, combined images of the mirrors into the proper position for use by the camera. This system may be configured in a variety of ways.

The earliest ringfield EUVL cameras as exemplified by Jewell et al., U.S. Pat. No. 5,315,629, that are designed for printing large (25 mm×25 mm) chips had instantaneous fields of view with an average radius of 25 mm and a chord length of 25 mm. When this type of ringfield camera is employed with the condenser of U.S. Pat. 5,361,292 the angle of the chord is 60 degrees which fit the 5 off-axis segments of the aspheric mirror, each 60 degrees wide, that comprise the illuminator or collecting mirrors of the condenser. However, with improved camera designs that have roughly the same chord length but with a somewhat larger, e.g., 30 mm, average radius of the ringfield, the angle of the chord is about 51 degrees, into which the six ring images created by the illuminator mirrors are fitted. Five times the 51 degrees is significantly less half of the 360 degrees available so that a condenser using the design presented in U.S. Pat. 5,361,292 would be fairly inefficient. A design using six segments is significantly better.

As discharge sources become more prevalent, there is a need for improved condensers that collect radiation from the discharge source and couples it to a ringfield camera.

SUMMARY OF THE INVENTION

The present invention is directed to a condenser that employs quasi grazing-incidence collector mirrors that are coated with a suitable reflective metal such as, for example, ruthenium (Ru) to collect radiation from a discharge source.

In one embodiment, the invention is directed to a condenser system for use with a scanning ringfield camera that includes:

a discharge source of radiation;

at least two sets of collector mirrors facing said discharge source wherein each set comprises at least two quasi-grazing incidence mirrors that are coated with a radiation reflective material and that are arranged such that radiation is reflected at a quasi-grazing incidence angle, with each set of collector mirrors having one focus at the radiation source and a second focus filling the object field of the camera at the radius of the ringfield and each producing a beam of radiation; and a corresponding number of sets of correcting mirror means which are capable of light beam translation or rotation, or both, such that all of the beams of radiation pass through the entrance pupil of the camera and form a coincident arc image at the ringfield radius.

In another embodiment, the invention is directed to a process for fabricating integrated devices that includes at least one element having a dimension $\leq 0.13$ μm and preferably $\leq 0.10$ μm by projection lithography that employs the inventive condenser system. Ruthenium is the preferred radiation reflective material that coats the coated collector or grazing-incidence mirrors.

The innovative architecture proposed herein connects the source to the camera quite efficiently, given the angle limitations due to the reflectance of ruthenium. The mirrors intercept about 60% of the flux inside a 44° half-angle cone. Reflectance losses and vignetting only reduce this by another 35%.

BRIEF DESCRIPTION OF THE DRAWINGS

FIGS. 2A and 2B illustrate the grazing incidence collectors in the condenser system;

FIGS. 4A and 4B are $Y$–$Y_{bar}$ diagrams for radial direction and sagittal direction, respectively;

DETAILED DESCRIPTION OF THE INVENTION

The condenser system of the present invention employs quasi grazing-incidence collector mirrors that exhibit superior resistance against contamination by debris from a discharge charge. While the invention will be described in conjunction with the condenser system depicted in FIGS. 1–3, it is understood that the inventive quasi grazing-incidence collector mirrors can be employed in any condenser system for use with a ringfield camera in EUV lithography. As is apparent, the selection of the optics and dimensions in designing the condenser system hereinafter described is to some extent governed by the choice of ringfield camera and by employing EUV at 13.5 nm.

The quasi-grazing incidence collector mirror is particularly suited for reflecting extreme ultra-violet radiation and more particularly radiation at 13.5 nm. The mirror comprises a conventional substrate that is coated with a suitable radiation reflecting metal. Contaminants from the discharge source will only minimally adhere to the metal surface when the mirrors are positioned to receive the radiation at the glancing angle described herein. The substrate can comprise, for example, silicon, glass or fused quartz which is coated with the radiation reflecting material. The material can include, for example, ruthenium, rhodium, tungsten, molybdenum, osmium, gold, tantalum, and alloys or mixtures thereof. Ruthenium is most preferred. The metal can be deposited by conventional means such as vapor deposition, sputtering, and the like. The thickness of the metal layer is typically about 50 to 1000 Angstroms and preferably about 200 to 800 Angstroms. Following deposition, the metal may also be optically polished. The quasi-grazing incidence mirrors typically have flat, elliptical, or general aspherical surfaces. As further described herein each quasi-grazing incidence collector mirror preferably has a conic (e.g., parabolic) cross-section in the r-z plane of the condenser system.

Figure 1:
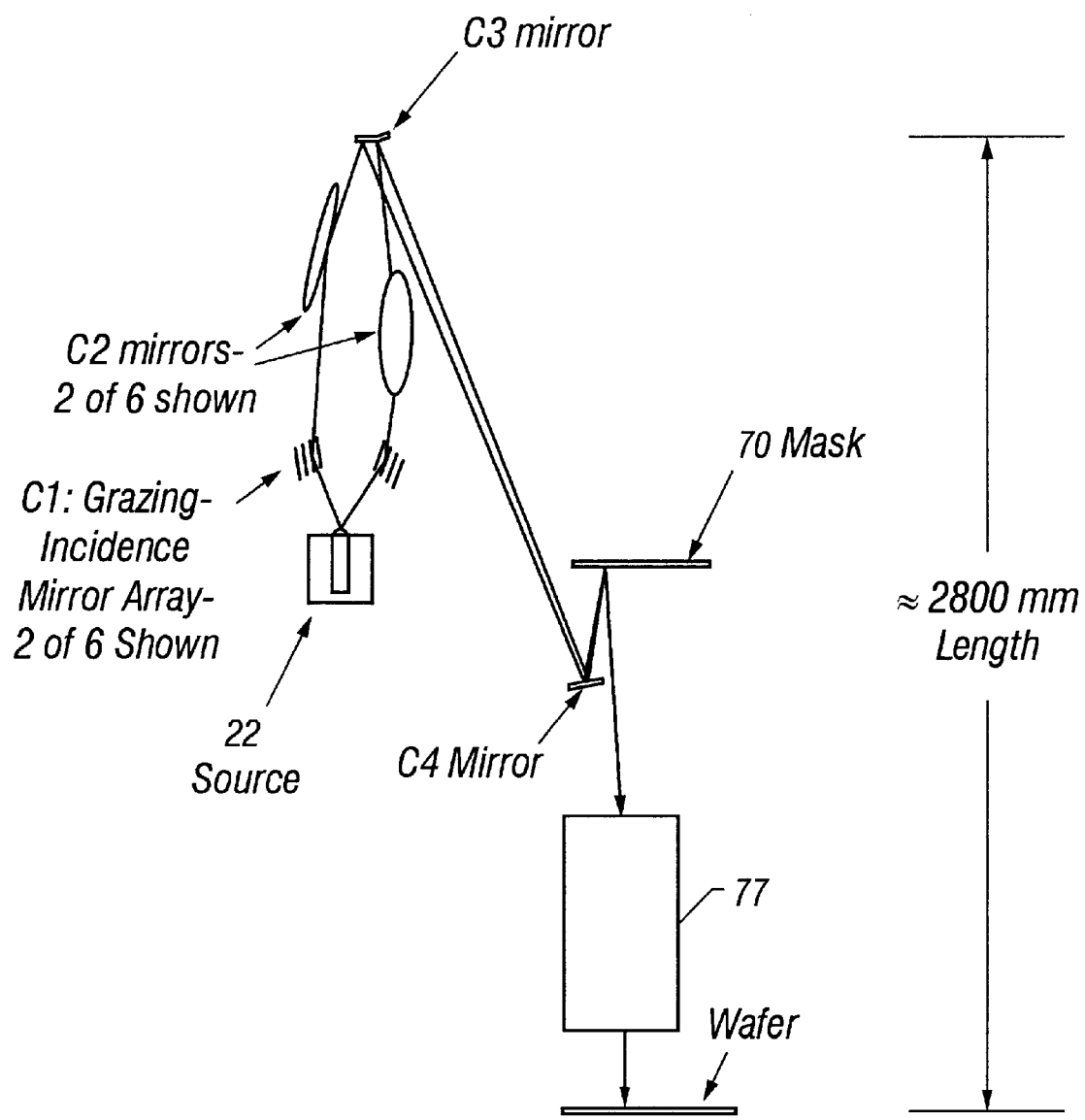
FIG. 1 is a schematic of an EUV photolithography system showing the beams going through its set of correcting mirrors and showing the interaction of the beam with the camera.

The overall layout of the EUV lithography is shown in FIG. 1. The condenser itself preferably has six channels and four collector optics per channel and for each channel, the first focusing element (C1) produces an arc-shaped image of the radiation discharge source 22. A preferred radiation discharge source comprises an intense pulsed capillary discharge source operating at 13.5 nm that is suitable for use in conjunction with Mo:Si or Mo:Be coated optics. The discharge source includes a small capillary discharge tube filled with xenon gas at low pressure to which electrodes are attached at each end. When a voltage is applied across the tube, an electrical current is generated for short periods within the capillary that produces highly ionized xenon ions radiating in the EUV. Discharge sources are also described in Klosner et al., "Intense Plasma Discharge Source at 13.5 nm for Extreme-Ultraviolet Lithography" *Opt. Lett.* 22, pp 34–36, 1997, which reports an intense lithium discharge plasma source created within a lithium-hydride capillary in which doubly-ionized lithium is the radiating species and in Klosner and Silfvast, "Intense Xenon Capillary Discharge Extreme-Ultraviolet Source in the 10–16 nm Wavelength Region", *Opt. Lett.* 23, pp 1609–1611, 1998, which reports the intense emission within the 10–16 nm wavelength region emitted by a xenon capillary discharge plasma with emission peaks at both 13.5 nm and 11.4 nm.

In FIG. 1, only two of the six mirror array of the parent C1 element are depicted and similarly only two of the six mirrors of the C2 mirrors are depicted. The second and third mirrors (C2 and C3, respectively,) rotate and point the beam so that all six curved line images (of the source) will illuminate the arcuate slit located in the reflective mask plane 70. Typically the number of sets of collector C1 mirrors employed is 4–12 and each set typically comprises 3 or 4 quasi-grazing incidence collector mirrors. The six beams are squeezed together in a real entrance pupil (at the C3 mirror plane) and then this pupil is imaged into the camera's virtual entrance pupil by the C4 mirror of the condenser. Beams of radiation reflected from the C3 mirror are reflected by a mirror C4 to deliver six overlapping ringfield segments onto reflective mask 70. The EUV lithography system also includes a ringfield camera 77 that has a set of mirrors (not shown) which images from reflective mask 70 onto wafer 78. The camera preferably has about a 1400 mm folded optical length. As is apparent, the C4 mirror follows the real entrance pupil.

FIGS. 2A and 2B show the quasi-grazing incidence collectors in the condenser system. Specifically, each C1 mirror preferably comprise a set of four nested, quasi-grazing incidence mirrors. Two nested groups 10A and 10B are shown. The near edges of the outer and inner mirrors of each four-mirror group are located at 125 mm and at 113 mm from the source. Typically the distance from the source is between about 100 mm to 200 mm. The angles of incidence are 65° and 76.4°, respectively. (The angle of incidence typically ranges from about 63° to 85°.) Steeper angles of incidence produce better reflectivity, however, these steeper angles mean that a unit area of mirror surface will provide less solid angle of reflection.

With a grazing (or quasi-grazing) incidence collector mirror, the distance from the source to the mirror varies significantly as the reflectance point moves across the mirror. This varies the magnification (i.e., ±10%) of the condenser system in the r-z plane (FIG. 2A). If the average magnification is chosen such that the magnified image of the source at the slit varies from too small to too large, some of the flux is wasted. Where it is too large, the slit trims off the top and bottom of the source image. Where the image is too small, the convergence angle is larger than it needs to be, wasting the fixed amount of collection angle that the camera allows (due to numerical aperture).

Principally because of the variable magnification problem, a single large grazing-incidence mirror is not desirable. This invention solves the problem by use of several nested mirrors that all have about the same average focal length, and thus, roughly the same magnification. From the magnification perspective, more nested mirrors would be better. However, the mirrors have a finite thickness implying a small gap (septa) between beams from adjacent mirrors. Using many nested mirror would result in many septa. The use of a four-mirror configuration offers one possible, approximately optimal design.

Quasi-grazing incidence mirrors that are coated with Ru are expected to reflect about 50% to 84% of the EUV when the angle of incidence is between 65° and 77°. This quasi-grazing incidence design should be relatively unaffected by the erosive nature of the discharge source for the following reasons: (1) the leading edges of the mirrors are quite far (113 mm to 125 mm) from the source 22 which should afford the mirrors some protection from the discharge; (2) the angles of incidence of the flux on the leading edges vary from 74° to 65°; and (3) surfaces can be coated with a layer of metal about 100 nm thick rather than a SiMo multilayer with 3.5-nm thick layers.

In FIG. 2B, the typical positions of the C2 and C3 mirrors are designated 4 and 6, respectively. The condenser of the present invention should provide a uniform illumination along the length of the camera's ring field. Furthermore, as shown in FIG. 1, there are two near normal mirrors in the condenser that precede the mask. These two mirrors will only reflect light "in-band", absorbing the rest. Thus, the mask will not have to absorb this unwanted heat. Locating the C1 mirrors farther from the source is better with 100 mm being the minimum and 150 mm being much better. However, as this distance is increased, the distance from the C1 mirror to the slit must also be longer. Distances from the collector mirror to the camera of 1.0 to 1.5 meters are reasonable, allowing enough separation between the source and the camera for the C2 and C3 mirrors.

Figure 3:
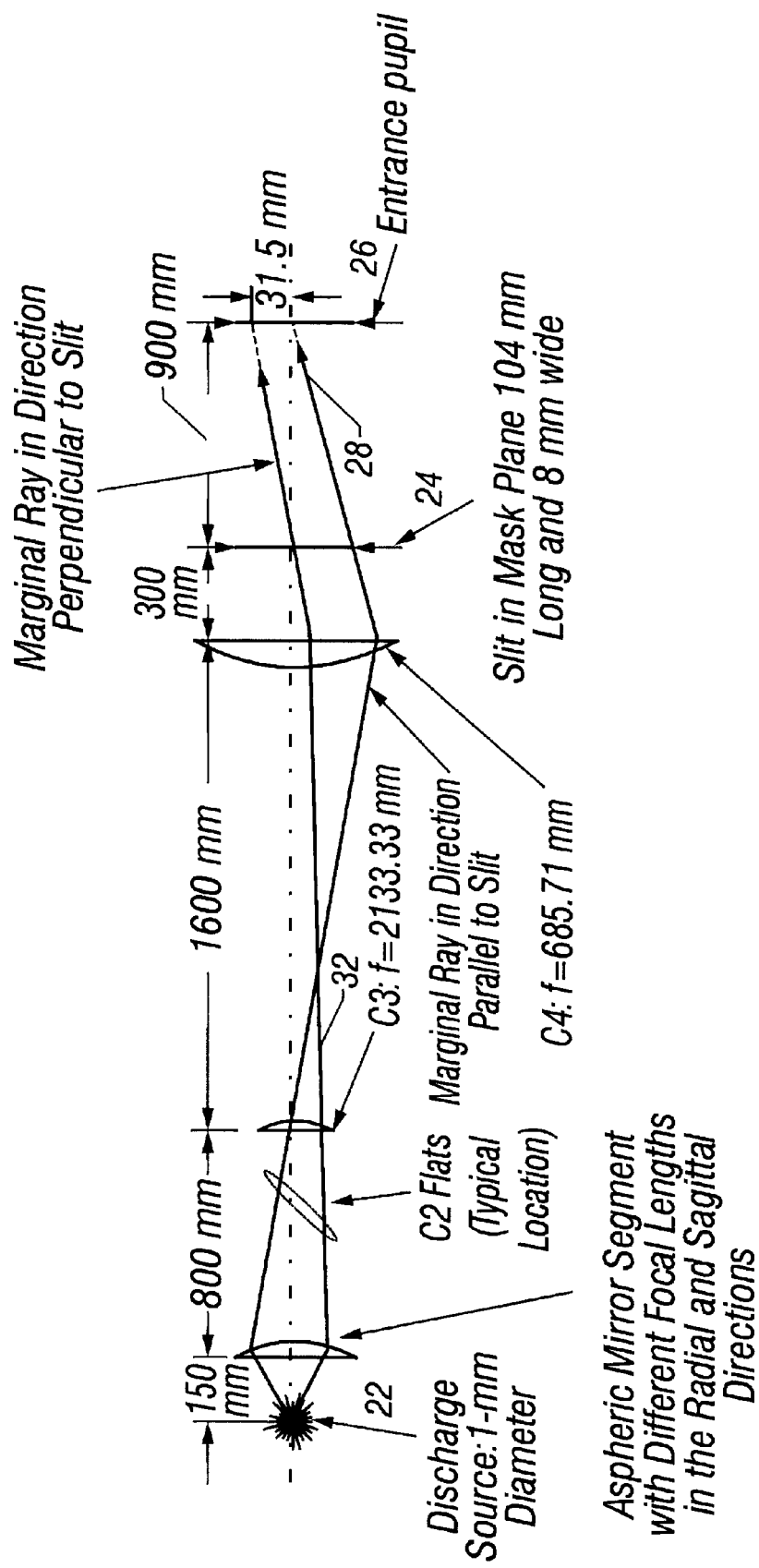
FIG. 3 is an unfolded view of the condenser system.

FIG. 3 shows an unfolded optical schematic, and the corresponding $Y-Y_{bar}$ for the system of the preferred embodiment for the radial direction and for the sagittal direction are shown in FIGS. 4A and 4B, respectively. Techniques for generating $Y-Y_{bar}$ diagrams are described, for example, in Shack, R. V., *Proceedings Soc. Photo-Opt Instr. Eng.*, vol. 39, 1973, p. 127–140. The schematic shows the path of the chief ray 28 and a marginal ray 32 beginning from source 22 to the entrance pupil 26. As is apparent from the two diagrams, the preferred system's focal properties are identical in the radial and sagittal directions, all except for the collector optic (C1). The system images the source into the slit in the radial direction, and roughly images it on the C3 mirrors in the sagittal direction. The optical system's folded length is about 2800 mm including the camera. As shown in FIG. 3, in a preferred system the (1) discharge source has a 1 mm diameter, (2) the C1 mirror has a $f_r$ of 150 mm at the far edge (note radial rays are shown between the source and C1), (3) the C2 mirror are typically flat, and (4) the slit 24 in the mask plane is 104 mm long and 8 mm wide.

As shown in FIG. 2A, the preferred C1 mirror array comprises a group of four nested, ruthenium-coated mirrors in each of the six channels. Each of the four mirrors has a conic, and preferably a parabolic, cross-section in the r-z plane, and the axis of each parabola is tilted inward a few degrees, for example, about 5.7° relative to the axis of symmetry of the mirror (thus creating a minimum-sized beam at the C3 mirrors and a ring focus at the mask plane). This design collects a hollow cone of radiation. The outer cone has preferably a half angle of about 45° and an inner cone half angle of about 20°.

Figure 5:
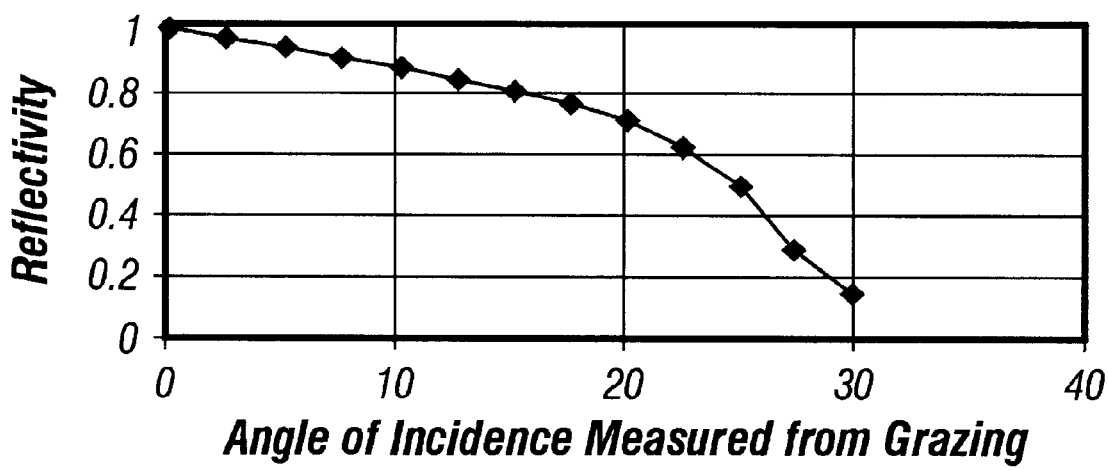
FIG. 5 is a graph of reflectivity of ruthenium vs. angle of incidence measure from grazing.

Ruthenium has a high reflectivity for angles of incidence greater than 65°. In FIG. 5 the average reflectivity for unpolarized light is plotted. As is apparent, the reflectivity decreases sharply at an angle of incidence of about 63°, so a minimum of about 65° is preferred.

Figure 6:
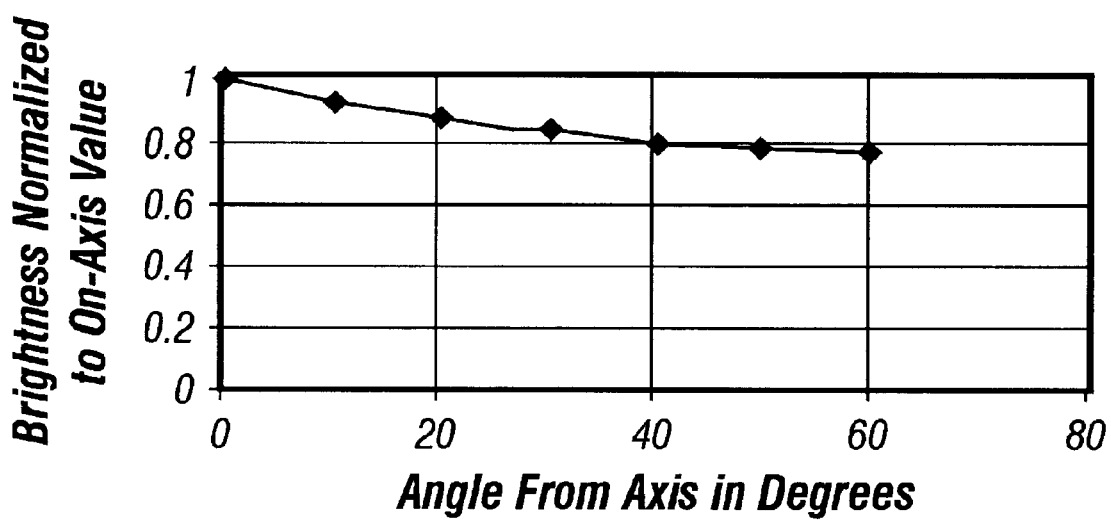
FIG. 6 is a graph of brightness (normalized) to on-axis value vs. angle from axis.

A preferred discharge source is created in a 1–1.5 mm diameter hollow cylinder. For a preferred embodiment, the EUV flux radiating from this source was measured as a function of angle in the r-z plane. As can be seen in FIG. 6, the flux is peaked on axis and tails off slowly as a function of angle. The plotted data has been normalized to the on-axis value. Since the source radiance is greatest near the axis of symmetry of the discharge source, the collector system is preferably centered on the axis of the source.

The preferred condenser of the present invention having six beam channels is particularly suited for camera designs that have a large numerical aperture and slit width which can compensate for the larger source size (na=0.25 and Δr=2 mm). For example, a design wherein the arc-shaped object field of the ring-field camera is about 51.4° arc means that six of the arc-shaped object fields will fit in 360°. This leaves a comfortable distance between adjacent mirrors for mirror support hardware and an adequate amount of mirror oversize.

The scanning ringfield camera for the condenser is preferably designed with an arcuate slit imaging field. The slit creates an arc angle of 51.4°. Thus, with the present condenser design, the 51.4° chords collected by the C1 mirrors must be delivered to the camera slit essentially undistorted. This implies that the C4 mirror (which images the C3 mirror array into the camera's entrance pupil) cannot be allowed to distort the beams. Therefore, the C4 mirror is a near-normal concave spherical mirror. For other camera designs that have smaller arc-angle image areas, one could either increase the number of collection channels in the condenser or distort the approximately 50° beam with a grazing-incidence C4 mirror as described, for example, in Sweatt et al., U.S. application Ser. No. 09/249,738 filed on Feb. 11, 1999, which is incorporated herein by reference.

Depending on the camera design, the etendue (or Lagrange invariant) of the camera in the radial direction and the radiation source size limit the amount of light that can pass through the camera unvignetted. The radial etendue is equal to: $\epsilon_{radial} = \Delta r\, na\, \theta 80\% \geq D_{source} \Delta \theta$, where $\Delta r$ is the slit width, $\Delta \theta$ is the difference angle between the inside and outside cones of light collected by the condenser, $\theta (\approx 70\%)$ is the partial coherence required for good imagery, and "80%" is the empirically derived approximate fill factor for the bowties in the entrance pupil. Given the camera parameters and the 1-mm source diameter, this equation predicts that collecting a cone of light should be less than 16°. Actually, this assumes that the C1 mirror is the aperture stop, which it is not (i.e., actually the C3 mirror is.) Second, it assumes that the source image is fit into the slit unvignetted. The total power delivered to the wafer can actually be increased by 10% to 15% if the cone's difference angle is increased and the source image is made slightly larger than the slit width. The collection angle has been increased to $\Delta \theta = 23°$ to accommodate both considerations.

The slit length is 13 times larger than its width so the camera's etendue in the sagittal direction is larger than what can be collected. In this design, the etendue of the light collected is limited by the geometry of the collection optics. In particular, the limiting parameter is the reflectivity of the ruthenium, which is R=50% (and falling fast) at an angle of incidence of 65°. With this minimum incidence angle, the maximum redirection angle of the C1 mirror is 50°. Thus, the outer angle of the collection cone is 50° minus the angle required to create the ring image, which is about 5.7° (typically the angle is between 5° and 6°.). Thus the outer collection angle is $\theta^{outer} = 45°$, and the inner angle is about 23° less, or $\theta_{inner} = 21.3°$.

As shown in FIG. 2A, the two nested groups of quasi-grazing incidence mirrors 10A and 10B are positioned to reflect radiation emanating from discharge source 22 and traveling through a light zone that is bordered by an inner cone defined by the inner angle and an outer cone defined by the outer angle. Each of the 4 quasi-grazing incidence mirrors in each nested group spans a part of this light zone to reflect some of the radiation. As a corollary, each quasi-grazing incidence mirror within each nested group reflects radiation at difference angles. Moreover, for each individual mirror the angle of incidence (and reflection) changes gradually from one end of the mirror to the other (as measured from the discharge source).

For convenience, a parabolic shape for the C1 mirror cross-section is chosen. Early designs suggested a hyperbolic mirror cross-section with one conjugate much larger than the other. This shape was very nearly a parabola, so the lengths were modified slightly to make it so. Note that the design shown in FIG. 3 allows enough room between the C1s and C3s for the grazing incidence C2 mirrors.

As mentioned above, the C1 mirror does not produce the limiting aperture in the system and so it preferably has to be over-sized. In the radial direction, the slit width and the C3 mirror height limit the beam size. The beam is limited in the sagittal direction by the source size and the length of the slit. Thus, the C1 mirror preferably is oversized in both directions. The radial collection angle for the mirror is 20° to 45°, which is about 3° larger than would be required for a point source. In the transverse direction, the arc length at the mask 70 is 51.4°. Each segment of the C1 optical element is preferably about 56° for the same set of reasons. The advantage of oversizing the C1 mirror array is that it produces a uniform intensity profile along the length of the slit.

The innovative condenser design is capable of collecting about 50% of the on-axis radiance. This is based on calculations using a hollow cone with 21° and 42° angles (representing the marginal ray size) that has a solid angle of about 1.24 sr. The septa reduce this to 0.94 sr. The average product of the reflectivity multiplied by the radiation source output is about 66%. This amount is further reduced to about 65% because the source image on the slit is slightly too large. Considering all of these effects, the total flux collected is equal to the on-axis radiance (flux per steradian) multiplied by 0.6.

The spacing between beams departing each of the six C1 mirror arrays was chosen to be 1.5 mm in the preferred embodiment. This should allow a mirror shell of adequate thickness. The beam approaching each mirror segment misses the adjacent mirrors by about 3 mm. In one embodiment, the mirrors on the leading edges are designed to be oversized thereby allowing the other ends of the mirrors to clip off the excess. In FIG. 1, it is shown that there is room behind each of the 4 mirror shells for a stiffener ring. The mirrors, if made conventionally, would be fairly thick. Typically the maximum dimension is no greater than 12 to 15 times the minimum thickness for adequate mechanical strength. This construction would results in undesirably wide septa. The use of stiffeners may allow the septa to be only a few millimeters wide.

If one uses fewer shells for the C1 focusing element, they will have to be bigger, so there is a greater range of image magnification. If one uses more mirrors, there are more septa. Design experiments suggest the use of either three or four nested shells in each C1 focusing element.

The distance from the radiation source to the C1 mirror varies in the radial plane, so at the near edge, the flux in the reflected beam is greater, but the image may overfill the slit. At the far edge, the opposite is true. The light delivered to the wafer is roughly the multiple of these two effects, and so it does not vary much until the mirrors get quite large.

In a particulary preferred embodiment, the condenser includes a four-mirror shell design, with each shell having a minimum magnification of 8×. (In FIG. 1, two of the six of the C1 grazing-incidence mirror array are shown, each array having a four mirror shell arrangement.) Therefore the source image fills the 8-mm wide slit for rays reflecting off the far end of each of the four mirrors. Ray bundles reflected by the rest of the mirror create images larger than 8 mm so these beams are slightly vignetted. Perhaps 5% of the light collected by C1 falls outside of the curved slit. The source size has a full-width half-maximum (FWHM) of 800 microns. The camera has a magnification of 4× with a slit width of 2 mm and numerical aperture of 0.25 at the wafer. At the mask, the slit width is r=8 mm and the numerical aperture is 0.0625. Thus, the magnification needs to be about 10 for this source and camera. A reasonable magnification ranges is 8 to 11.

The distances between the mirror groups (C1, C2, C3 and C4) are linked to one another, so if one distance is selected, the rest of them will be set. For instance, choosing the distance between C3 and C4 ($L_{C3-C4}$) to be 1600 mm sets the distance between the source and the (far end of the) C1 mirrors. It has to be one-eighth as large, that is, $L_{source-C1}$= 150 mm. The distance $L_{C1-C3}$ is also set when $L_{C3-C4}$ is chosen. Since the C1 mirror array creates a ring focus, the other focus is on the axis where each ring of rays intersects. In the r-z plane, a ray in the center of the bundle will cross the axis of symmetry of the parent mirror at the C3 mirror to minimize the size of the footprint there. These rays continue, reflecting off the C3 and C4 mirrors, and on to the ringfield at the mask plane, which typically has a 120-mm radius. This architecture sets the angle between the rays and the centerline of the beam. This angle, which is preferably 5.7°, is the same on both sides of the C3 mirror. It sets the $L_{C1-C3}$ distance because the size of the C1 mirror is specified. The average radius of the C1 mirror is preferably 80 mm, so $L_{C1-C3}$=800 mm.

The length of the optical path is chosen to be about 2.8 meters from the C3 array to the wafer plane as shown in FIG. 3. A shorter system is less efficient. For example, if $L_{C3-C4}$=1200 mm, the system length is 2.4 meters; however, this shorter condenser has about a 5% lower efficiency.

Condensers of the present invention are particularly suited for use in projection lithography for fabricating integrated devices that comprise at least one element having a dimension of ≦0.13 μm and preferably ≦0.10 μm. The process comprises construction of a plurality of successive levels by lithographic delineation using a mask pattern that is illuminated to produce a corresponding pattern image on the device being fabricated, ultimately to result in removal of or addition of material in the pattern image regions. Typically, where lithographic delineation is by projection, the collected radiation is processed to accommodate imaging optics of a projection camera and image quality that is substantially equal in the scan and cross-scan directions, and smoothly varying as the space between adjacent lines varies. In a preferred embodiment, projection comprises ringfield scanning comprising illumination of a straight or arcuate region of a projection mask. In another preferred embodiment, projection comprises reduction ringfield scanning in which an imaged arcuate region on the image plane is of reduced size relative to that of the subject arcuate region so that the imaged pattern is reduced in size relative to the mask region.

The maximum possible system efficiency is a function of the size of the source, the camera parameters, and the reflectivities of the mirrors, and, of course, the basic design of the condenser. The collection efficiency depends on the Entendue of the whole optical system. The Entendue or Lagrange invariant derived from the theorm of conservation of energy and indicates that, for an unvignetted pencil of light, the product of image height and numerical aperture is the same at all image planes in the system. This leads to an equivalence between source parameters (volume and collection angle) and camera parameters (ringfield width and numerical aperture). If one were to illuminate the ringfield with only one beam, one could use its entire numerical aperture. However, with six beams one can only use about one sixth of the entrance pupil area for each beam.

The transmission efficiency of the beam lines depends on the reflectivity of the mirrors. At 13.5 nm, the theoretically perfect reflectivities are about 66%, 85%, 72% and 72%, where the first number is the average reflectivity of the grazing incidence collector (C1), the next is for the flats (C2), the next for the mirror at the real entrance pupil (C3), and the last is for the reimaging concave spherical mirror (C4). The product of these ideal reflectivities is about 30%, which means that theoretically, 6.8% the soft x-rays from the source can be delivered to the mask. With real reflectivities, one can expect more on the order of 6.1% of the EUV radiated into a hemisphere to be delivered.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A condenser system for use with a scanning ringfield camera comprising:
   a discharge source of radiation;
   at least two sets of collector mirrors facing said discharge source wherein each set comprises at least two quasi-grazing incidence mirrors that are coated with a radiation reflective material and that are arranged such that radiation is reflected at a quasi-grazing incidence angle, with each set of collector mirrors having one focus at the radiation source and a second focus filling the object field of the camera at the radius of the ringfield and each producing a beam of radiation; and
   a corresponding number of sets of correcting mirror means which are capable of light beam translation or rotation, or both, such that all of the beams of radiation pass through the entrance pupil of the camera and form a coincident arc image at the ringfield radius.

2. The condenser system of claim 1 wherein the said at least two sets of collector mirrors comprise four to twelve sets of quasi-grazing incidence mirrors.

3. The condenser system of claim 2 wherein each set of collector mirrors has three or four quasi-grazing incidence mirrors receiving light from the discharge source at a quasi-grazing angle of incidence.

4. The condenser system of claim 1 wherein the surface of each of said at least two quasi-grazing incidence mirrors is coated with a material that is selected from the group consisting of ruthenium, rhodium, tungsten, molybdenum, osmium, gold, tantalum, carbon, and alloys or mixtures thereof.

5. The condenser system of claim 1 wherein the surface of each of said at least two quasi-grazing incidence mirrors is coated with ruthenium.

6. The condenser system of claim 1 wherein said at least two quasi-grazing incidence mirrors are designed and oriented such that the angle of incidence is within the range between about 63° to 85°.

7. The condenser system of claim 6 wherein for each set of collector mirrors, the individual quasi-grazing incidence mirror reflects radiation at different angles.

8. The condenser system of claim 1 wherein said at least two quasi-grazing incidence mirrors have leading edges that are positioned about 100 mm to 200 mm from the discharge source of radiation.

9. The condenser system of claim 4 wherein each of said two quasi-grazing incidence mirrors has a conic cross-section in the r-z plane.

10. The condenser system of claim 4 wherein each of said two quasi-grazing incidence mirrors has a parabolic cross-section in the r-z plane.

11. A process for fabrication of a device comprising at least one element having a dimension $\leq 0.13$ $\mu$m, such process comprising construction of a plurality of successive levels, construction of each level comprising lithographic delineation, in accordance with which a subject mask pattern is illuminated to produce a corresponding pattern image on the device being fabricated, ultimately to result in removal of or addition of material in the pattern image regions, in which illumination used in fabrication of at least one level is extreme ultra-violet radiation, characterized in that the process employs a condenser system as defined in claim 1.

12. The process of claim 11 wherein the device fabricated has at least one element having a dimension of $\leq 0.10$ $\mu$m.

13. The process of claim 11 in which lithographic delineation is by projection, and in which collected radiation is processed to accommodate imaging optics of a projection camera.

14. The process of claim 13 wherein projection comprises ringfield scanning comprising illumination of a straight or arcuate region of a projection mask.

15. The process of claim 13 in which projection comprises reduction ringfield scanning in accordance with which an imaged arcuate region on the image plane is of reduced size relative to that of the subject arcuate region so that the imaged pattern is reduced in size relative to the mask region.

16. The process of claim 11 wherein the said at least two sets of quasi-grazing incidence mirrors comprise four to twelve sets of collector mirrors.

17. The process of claim 16 wherein each set of quasi-grazing incidence mirrors has three or four collector mirrors receiving light from the discharge source at a quasi-grazing angle of incidence.

18. The process of claim 11 wherein the surface of each of said at least two quasi-grazing incidence mirrors is coated with a material that is selected from the group consisting of ruthenium, rhodium, tungsten, molybdenum, osmium, gold, tantalum, carbon and alloys or mixture thereof.

19. The process of claim 11 wherein the surface of each of said quasi-grazing incidence mirrors is coated with ruthenium.

20. The process of claim 11 wherein said at least two quasi-grazing incidence mirrors are designed and oriented such that the angle of incidence is within the range between about 63° to 85°.

21. The process of claim 20 wherein for each set of collector mirrors, the individual quasi-grazing incidence mirror reflects radiation at different angles.

22. The process of claim 11 wherein said at least two of the quasi-grazing incidence mirrors have leading edges that are positioned about 100 mm to 200 mm from the discharge source of radiation.

23. The process of claim 18 wherein each of said two quasi-grazing incidence mirrors has a conic cross-section in the r-z plane.

24. The process of claim 18 wherein each of said two quasi-grazing incidence mirrors has a parabolic cross-section in the r-z plane.

* * * * *